United States Patent
Baughman

(10) Patent No.: US 9,857,431 B2
(45) Date of Patent: Jan. 2, 2018

(54) BATTERY CELL VOLTAGE SENSING CIRCUIT DIAGNOSTICS

(71) Applicant: GM GLOBAL TECHNOLOGY OPERATIONS LLC, Detroit, MI (US)

(72) Inventor: Andrew C. Baughman, Northville, MI (US)

(73) Assignee: GM Global Technology Operation LLC, Detroit, MI (US)

( * ) Notice: Subject to any disclaimer, the term of this patent is extended or adjusted under 35 U.S.C. 154(b) by 659 days.

(21) Appl. No.: 14/339,003

(22) Filed: Jul. 23, 2014

(65) Prior Publication Data

US 2016/0025815 A1 Jan. 28, 2016

(51) Int. Cl.
*G01R 31/36* (2006.01)
*G01R 31/02* (2006.01)

(52) U.S. Cl.
CPC ........ *G01R 31/3658* (2013.01); *G01R 31/026* (2013.01)

(58) Field of Classification Search
CPC ............ G01R 31/3606; G01R 31/3658; G01R 31/3679; G01R 31/3686; H01L 2224/4321; H01L 2924/16151; H01L 2924/00011; H01L 2224/85205; H01L 2924/00014; H01L 2224/45144; H01L 2224/45139
See application file for complete search history.

(56) References Cited

U.S. PATENT DOCUMENTS

| | | | |
|---|---|---|---|
| 6,268,710 B1* | 7/2001 | Koga | G01R 31/3624 320/116 |
| 8,614,563 B2 | 12/2013 | Baughman | |
| 8,788,225 B2* | 7/2014 | Wood | G01R 31/362 320/136 |
| 9,588,181 B2* | 3/2017 | Nortman | H02J 7/0016 |
| 2010/0100345 A1* | 4/2010 | Katrak | G01R 19/2509 702/65 |
| 2012/0139553 A1* | 6/2012 | Nortman | H02J 7/0016 324/537 |
| 2014/0055896 A1* | 2/2014 | Muramoto | H02H 7/18 361/86 |
| 2014/0327400 A1* | 11/2014 | Kudo | H02J 7/0016 320/118 |
| 2016/0061874 A1* | 3/2016 | Nakai | G01R 31/3679 324/426 |

* cited by examiner

Primary Examiner — Patrick King
(74) Attorney, Agent, or Firm — Quinn IP Law

(57) ABSTRACT

A system and method are disclosed for diagnosing an open circuit of a cell voltage sensing board. The board includes, for each cell, a line balancing resistor, a line sense resistor, and a gate. Each gate connects and disconnects a given line balancing resistor to and from a corresponding cell. A cell voltage is measured for a selected battery cell, and a controller determines if the selected battery cell is an uppermost or lowermost cell in the battery stack. A line sense resistance value is calculated for the selected battery cell using a first set of equations when the selected battery cell is the uppermost cell, a second set of equations when the selected battery cell is the lowermost cell, and a third set of equations when the selected battery cell is neither. A control action is executed when the calculated line sense resistance exceeds a calibrated resistance threshold.

9 Claims, 2 Drawing Sheets

BATTERY CELL VOLTAGE SENSING CIRCUIT DIAGNOSTICS

TECHNICAL FIELD

The present disclosure relates to battery cell voltage sensing circuit diagnostics.

BACKGROUND

Certain vehicles are propelled via high-voltage electrical energy. For example, hybrid electric vehicles, plug-in hybrid electric vehicles, and extended-range electric vehicles typically have one or more hybrid and electric-only operating modes. A rechargeable battery pack with multiple battery cells is used to alternatively store and deliver the required electrical energy for driving an electric fraction motor or motors of the vehicle's propulsion system. Electrical parameters of the individual battery cells are periodically monitored via one or more cell sensing boards for various control purposes, including cell charge balancing and as an input parameter to powertrain control and/or hybrid mode selection logic.

SUMMARY

A method is disclosed herein for diagnosing a cell voltage sensing board. The method looks specifically for measurements corresponding to broken cell voltage sensing wires. In a particular embodiment, the method includes connecting the cell voltage sensing board to battery cells of a battery stack. The battery stack may include all of the available battery cells for a given battery pack, but more typically includes only a subset of the available battery cells. The cell voltage sensing board includes, for each of the battery cells, a sense line resistor, a line balancing resistor, and a gate, with actuation of the gate connecting and disconnecting the line balancing resistor from a corresponding one of the battery cells. The gate may be a solid-state switch or other suitable switching device, for instance positioned on an application-specific integrated chip (ASIC).

The method includes measuring a cell voltage via the cell voltage sensing board for a selected one of the battery cells, and then determining if the selected battery cell is an uppermost or lowermost battery cell in the particular battery stack being tested, with "uppermost" and "lowermost" referring to the relative positions of the battery cells within the battery stack. The method also includes calculating an equivalent resistance value for the sense line resistor for the selected battery cell, via a controller, using a first set of equations when the selected battery cell is the uppermost cell, using a second set of equations when the selected battery cell is the lowermost cell, and using a third set of equations when the selected battery cell is neither the uppermost cell nor the lowermost cell. The controller then compares the calculated equivalent resistance value to a calibrated resistance threshold, and thereafter executes a control action with respect to the cell voltage sensing board when the calculated equivalent resistance value exceeds the calibrated resistance threshold.

Measuring a cell voltage includes closing the gate corresponding to the selected battery cell, e.g., via transmission of an output signal to the gate from the controller. Measuring the cell voltage occurs only when a cell current balancing operation is not active.

The first, second, and third sets of equations may each include two different equations. In such an approach, calculating the equivalent resistance value includes solving both of the equations and then using the maximum value of the two solutions to conduct the threshold comparison.

The control action may include recording a diagnostic code in memory of the controller when an open circuit fault is detected, preventing the use of data for the selected battery cell, and/or temporarily disabling the use of the selected battery cell.

A system is also disclosed that includes a cell voltage sensing board and a controller. The cell voltage sensing board, which is connectable to a plurality of battery cells of a battery stack, includes, for each battery cell in the stack, a line balancing resistor, a sense line resistor, and a gate that connects and disconnects the line balancing resistor from a corresponding one of the battery cells. The controller is programmed to execute the method noted above.

The above and other features and advantages will be readily apparent from the following detailed description when taken in connection with the accompanying drawings.

DETAILED DESCRIPTION

Figure 1:
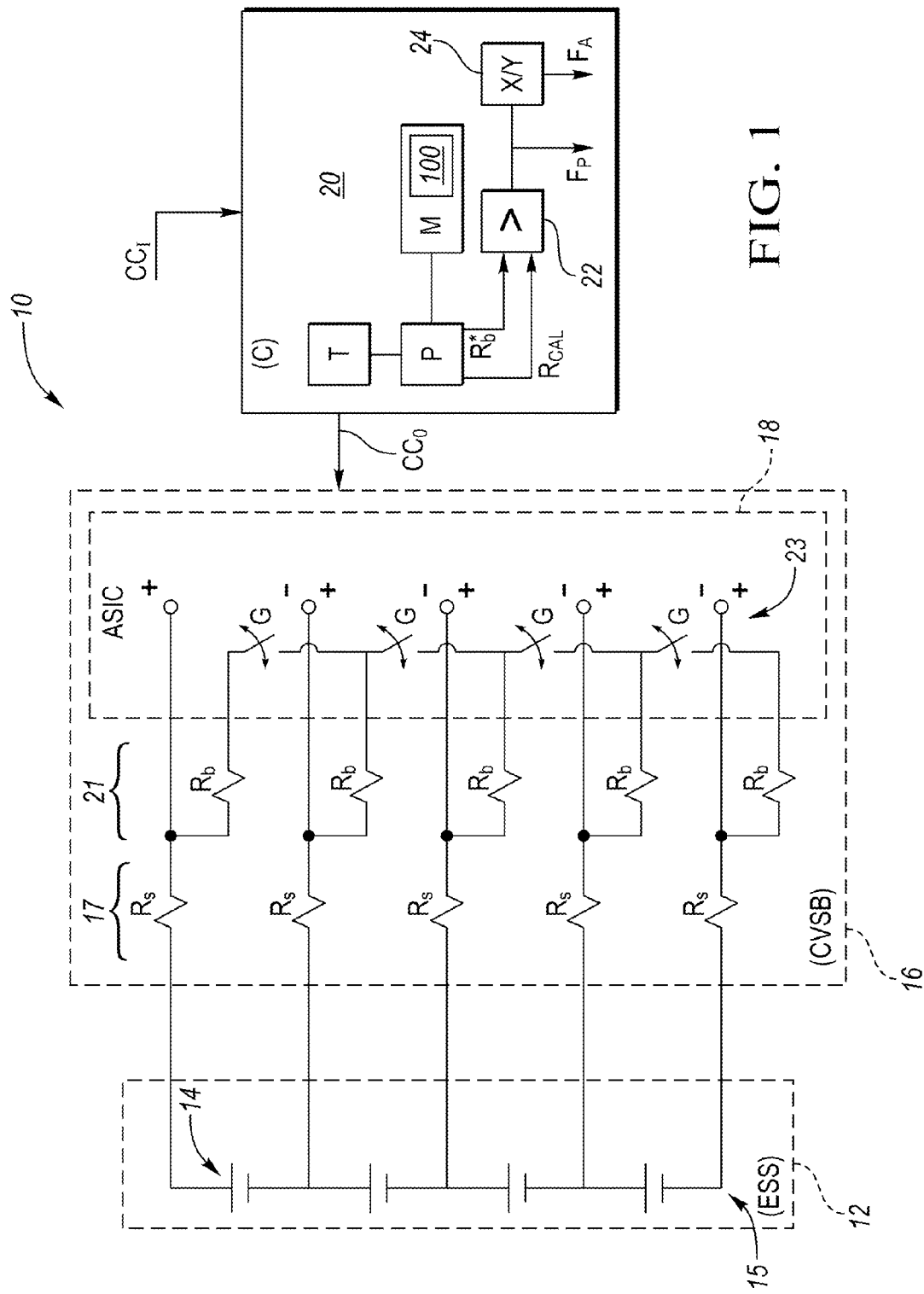
FIG. 1 is a schematic illustration of a system having a battery stack with multiple battery cells, a battery cell voltage sensing board, and a controller as described herein.

Referring to the drawings, a system 10 is shown schematically in FIG. 1. The system 10 includes a rechargeable energy storage system (ESS) 12 having a plurality of battery cells 14. The system 10 also includes a cell voltage sensing board (CVSB) 16 and a controller (C) 20. The controller 20 is programmed to execute instructions embodying a method 100, an example of which is described below with reference to FIG. 3, to thereby diagnose the performance of the CVSB 16. Specifically, the method 100 is executed to determine if there is a broken wire or other open circuit between a given one of the battery cells 14 and the CVSB 16. The controller 20 uses existing sensor data to calculate an equivalent line resistance value for each of the battery cells 14 of the ESS 12, doing so using fewer intrusive data reads than in existing diagnostic approaches.

In particular, the data used herein is measured when a sensed cell voltage is low-impedance relative to a voltage source, i.e., each of the battery cells 14, even in the presence of an open circuit fault. A goal of the present method 100 is to avoid the unreliable detection of such electrical faults, and thus to minimize instances of false failure. Unlike certain approaches for diagnosing open circuits in a cell voltage sensing board such as the CVSB 16 of FIG. 1, the present method 100 does not require that the cell voltages of adjacent battery cells 14 all equalize prior to an "all gates off" reading in order to detect a true open circuit line fault.

The ESS 12 shown in FIG. 1 may be configured with a sufficient number of the battery cells 14 for storing the requisite high-voltage electrical energy for a given function, such as for propelling a vehicle (not shown). In a typical vehicle propulsion embodiment, for instance, anywhere from 24 to 112 of the battery cells 14 may be used in the construction of the ESS 12, with each battery cell 14 rated for 3-4 VDC in such an embodiment. For illustrative simplicity, only four battery cells 14 are shown in FIG. 1 to represents a battery stack 15, with multiple battery stacks 15 being combined to form a typical battery pack for the ESS 12 with a desired amount of DC output voltage. The battery cells 14 may be embodied as lithium ion cells, nickel metal hydride cells, or other rechargeable electrochemical cells providing the required power density, as well as any required conductive interconnecting rails and battery support structure.

The CVSB 16 of FIG. 1 includes various normal sense line resistors 17 each having a normal sense line resistance $R_S$, one or more cell balancing resistors 21 each with a line balancing resistance $R_b$, and gates G, e.g., solid state switches in the form of relays or contactors. In an example embodiment, the normal line balancing resistance $R_b$ may be 5.1Ω. Such a value is well suited to the representative, non-limiting cell voltages of 3-4 VDC noted above, but may vary with the design without departing from the intended inventive scope.

The gates G and the associated±voltage pins 23 carrying the positive (+) and negative (-) voltages for a given battery cell 14 may reside on an application-specific integrated chip (ASIC) 18 as shown, with the closing or opening of some or all of the gates G occurring as needed in response to transmission of output signals (CCo) from the controller 20 to the ASIC 18, and thus to the gates G. Residency on the ASIC 18 is not required within the scope of the present method 100, as some or all of the functions may reside on, for instance, a microprocessor. Thus, the gates G are in communication with a controller 20 and are independently responsive to the output signals (CCo) from the controller 20 in execution of the method 100 as explained below. For a battery stack 15, the controller 20 may open every other gate G in one testing loop, then close these and open the remaining gates G, such that every other battery cell 14 is tested together at a given time.

Still referring to FIG. 1, the controller 20 executes the diagnostic method 100 to periodically diagnose the performance of the CVSB 16. The controller 20 may be configured as a digital computer having a processor (P) and memory (M), including tangible, non-transitory memory, e.g., optical and/or magnetic read only memory (ROM), as well as random access memory (RAM) and electrically-erasable programmable read only memory (EEPROM). The controller 20 includes a high-speed clock (T), as well as analog-to-digital (A/D) and digital-to-analog (D/A) circuitry, and input/output circuitry and devices (I/O), and signal conditioning and buffer circuitry. Any algorithms or computer-executable code resident in the controller 20 or accessible thereby, including any code or instructions necessary for implementing the method 100, can be stored in memory (M) and automatically executed by the processor (P) to diagnose ongoing performance of the CVSB 16.

Figure 2:
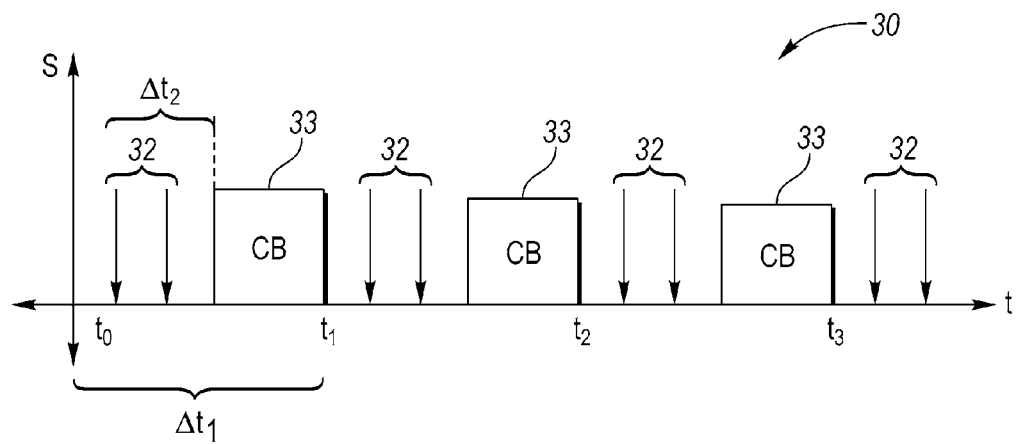
FIG. 2 is a time plot of control signals of the controller of FIG. 1, with time plotted on the horizontal axis and signal state plotted on the vertical axis.

Referring briefly to FIG. 2, an example time plot 30 is depicted with a test logic state (S) plotted on the vertical axis and time (t) plotted on the horizontal axis. The controller 20 is programmed to sense an open circuit fault, but other logic may be executed that requires control of the gates G shown in FIG. 1. For example, for other control logic not described herein, some or all of the gates G may be commanded open or closed, such as for conducting current or charge balancing operations of the battery cells 14. This mode is represented in FIG. 2 as current balancing (CB) pulses 33.

The time period spanning from time $t_0$ to the completion of a first of the CB pulses 33 is represented as $\Delta t_1$, which may be on the order of 100-200 ms. The controller 20 performs diagnostic sampling (arrows 32) in executing the method 100 within the time period $\Delta t_2$ during which the CB pulses 33 are not active, i.e., immediately after $t_0$, $t_1$, $t_2$, $t_3$, etc., with the sampling period of time period $\Delta t_2$ being significantly shorter than that of time period $\Delta t_1$. By way of an example embodiment, when the time period $\Delta t_2$ is 5-20 ms, the time period $\Delta t_1$ is 100-200 ms. The controller 20 may be programmed to complete one full sampling of all of the battery cells 14 of the CVSB 16 within the shorter time period $\Delta t_2$.

Figure 3:
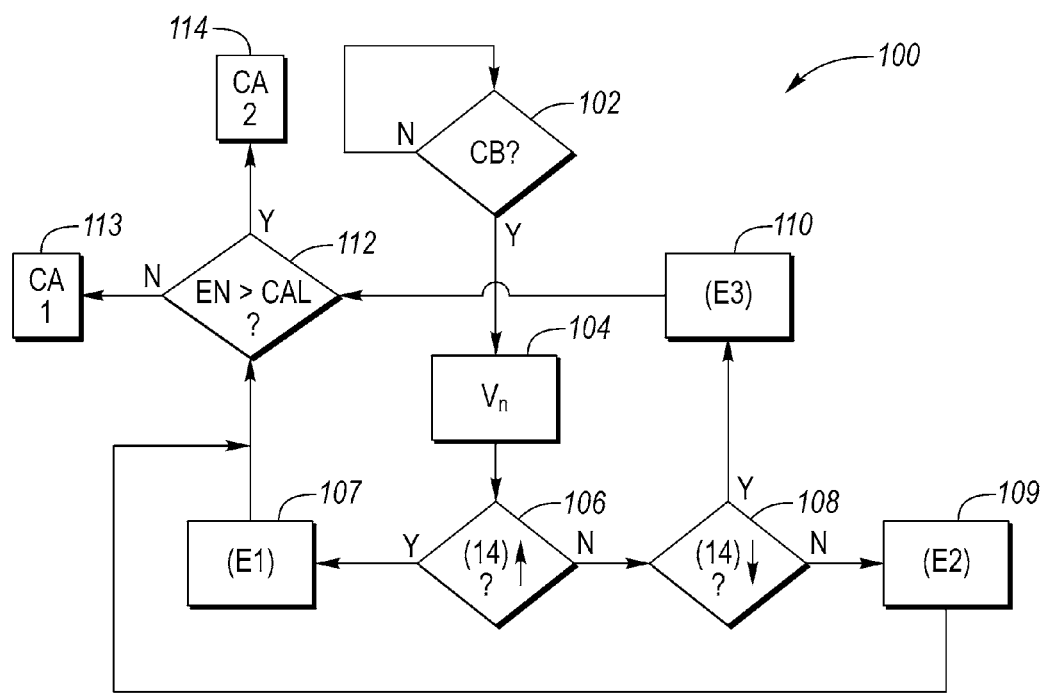
FIG. 3 is a flow chart describing an example method for diagnosing the battery cell voltage sensing board via the controller of FIG. 1.

Referring to FIG. 3 in conjunction with FIG. 1, in an example embodiment the method 100 commences at step 102. At step 102, the controller 20 determines if a cell balancing operation is active. As shown in FIG. 2 via the cell balancing pulses 33, the controller 20 can conduct the method 100 only when the cell balancing pulses 33 are not active. Step 102 is repeated until a cell balancing pulse 33 is inactive, at which point the method 100 proceeds to step 104.

At step 104, the controller 20 samples, measures, or otherwise determines the cell voltage ($V_n$) for a selected one of the battery cells 14 of FIG. 1. Step 104 entails closing the corresponding gate G for the battery cell 14 whose cell voltage is being measured, and then reading the cell voltage at the corresponding pin 23 for that particular battery cell 14, e.g., via the ASIC 18 in the example embodiment of FIG. 1. The measured voltage ($V_n$) is temporarily recorded in memory (M) before the method 100 proceeds to step 106.

Step 106 entails determining whether the battery cell 14 whose voltage was measured at step 104 is the "uppermost" cell in the battery stack 15 being tested, with "uppermost" represented in step 106 of FIG. 3 by an upwardly-pointing arrow (↑). That is, each battery cell 14 has a relative position in the battery stack 15, with each position being known by the controller 20, e.g., stored in memory (M), and thus the identity of the particular battery cell 14 is used to make this determination. The method 100 proceeds to step 107 if the battery cell 14 is the uppermost cell in the battery stack 15, and to step 108 in the alternative if the battery cell 14 is not the uppermost cell.

At step 107, the controller 20 solves a first set of programmed equations (E1) when the battery cell 14 is the uppermost cell, such as:

$$\frac{2R_b \cdot (V_n^{nok} - V_n^{ok}) - R_s \cdot (V_n^{ok} + V_{n-1}^{ok})}{V_n^{ok}}$$

$$\frac{2R_b \cdot (V_n^{nok} - V_n^{ok}) - R_s \cdot (V_n^{ok})}{V_n^{ok} + V_{n-1}^{ok}}$$

These two equations cover two assumed cases: that the open sense line is assumed to be on the positive (+) line and the negative (-) line of an HV bus, respectively. In these two equations, $R_b$ is the cell balancing resistance, $R_S$ is the normal sense line resistance, n, n-1, and n+1 are subscripts on the cell voltages V for battery cells n, n-1, and n+1, while the balance gate G is enabled/closed and the adjacent gates G are of the opposite state. At step 107, the controller 20 solves both of these equations, takes the maximum of the two solutions, and then proceeds to step 112. The maximum solution is the calculated cell sense resistance $R_S^*$.

Step 108 entails determining if the battery cell 14 from step 104 is the "lowermost" cell in the battery stack 15, as indicated in FIG. 3 by the downward-pointing arrow (↓). The method 100 proceeds to step 110 when the battery cell 14 is the lowermost cell in the battery stack 15. Otherwise, the method 100 determines that the battery cell 14 being tested is neither the uppermost nor the lowermost cell in the battery stack 15 and proceeds to step 109.

At step 109, the controller 20 solves a second set of equations (E2), e.g.,:

$$\frac{2R_b \cdot (V_n^{nok} - V_n^{ok}) - R_s \cdot (V_n^{ok} + V_{n-1}^{ok})}{V_n^{ok} + V_{n+1}^{ok}}$$

$$\frac{2R_b \cdot (V_n^{nok} - V_n^{ok}) - R_s \cdot (V_n^{ok} + V_{n+1}^{ok})}{V_n^{ok} + V_{n-1}^{ok}}$$

As with step 107, the two equations (E2) cover two assumed cases, i.e., that the open sense line is assumed to be on the respective positive leg and the negative leg of an HV bus. The controller 20 of FIG. 1 solves both of these equations, takes the maximum, and proceeds to step 112.

At step 110, the controller 20 solves a third set of equations (E3), an example of which is set forth as follows:

$$\frac{2R_b \cdot (V_n^{nok} - V_n^{ok}) - R_s \cdot (V_n^{ok})}{V_n^{ok} + V_{n+1}^{ok}}$$

$$\frac{2R_b \cdot (V_n^{nok} - V_n^{ok}) - R_s \cdot (V_n^{ok} + V_{n+1}^{ok})}{V_n^{ok}}$$

As with step 107, the two equations cover two assumed cases, i.e., that the open sense line is assumed to be on the positive leg and the negative leg, respectively. The controller 20 solves both of these equations, takes the maximum value, and proceeds to step 112.

Step 112 includes comparing the calculated maximum result (EN) from steps 107, 109, or 110, i.e., the calculated cell sense line resistance $R_S^*$, to a calibrated resistance $R_{CAL}$. If the calculated maximum result (EN) exceeds the calibrated resistance ($R_{CAL}$), the method 100 proceeds to step 114. The method 100 proceeds to step 113 in the alternative if the calculated maximum result (EN) does not exceed the calibrated resistance ($R_{CAL}$).

At step 113, the controller 20 executes a first control action (CA 1) with respect to the CVSB 16. Step 114 may entail clearing a diagnostic code from memory (M) of the controller 20 for the particular battery cell 14 being evaluated to indicate that an open circuit was not detected for this battery cell 14.

At step 114, the controller 20 of FIG. 1 executes a second control action (CA 2) with respect to the CVSB 16. Step 114 may entail recording a failing diagnostic code in memory (M) for the particular battery cell 14 being evaluated. Step 114 may entail taking additional actions, such as not allowing use of data for the particular battery cell 14, or temporarily preventing use of the battery cell 14 in the control of any top-level system in which the battery stack 15 is used, e.g., a vehicle powertrain, or even disabling the top-level system until the battery cell 14 can be properly evaluated. That is, if the calculated sense line resistance $R_S^*$ is too high relative to the calibrated resistance threshold, then line resistance is higher than expected. As a result, any line balancing current will be lower than it should be, and voltage sensing provided by the CVSB 16 could be inaccurate.

Referring again to FIG. 1, the controller 20 may be optionally programmed to execute a maturation process as part of steps 113 and 114. For instance, the controller 20 may be programmed with a comparison block 22 that can receive the calculated sense line resistance $R_S^*$ and the calibrated resistance ($R_{CAL}$). If the calculated sense line resistance $R_S^*$ exceeds the calibrated resistance ($R_{CAL}$), the controller 20 may record a possible failure ($F_P$) in memory (M).

The controller 20 can thereafter execute a maturation routine via a maturation block 24. In such a maturation block 24, the controller 20 can consider whether in a sample size of Y samples over a calibrated duration, as counted via the timer (T), there have been at least X failing results, i.e., X/Y=⅘ in a possible embodiment. Thus, the controller 20 can avoid taking a control action until an actual failure is detected via the X/Y failure determination at the maturation block 24. The controller 20 may record an actual failure ($F_A$) in memory (M) when a ⅘ or other calibrated threshold X/Y result occurs.

Use of the method 100 and controller 20 of FIG. 1 therefore addresses potential issues in existing diagnostic methods, such as those that use a ratio or difference between a sensed cell voltage with its gate G closed/applied and with the same gate G open/released. The controller 20 can sample all of the battery cells 14 of FIG. 1 when only even cell balancing gates G are enabled, and sample the battery cells 14 again when only odd cell balancing gates G are enabled. With these two reads, there are no voltages left floating in an open-sense line scenario.

A key feature of the present approach is that when a sense line is open circuit, turning off all of the charge balancing resistors 21 does not guarantee that the affected voltage returns to a "normal" range of cell voltage. The cell voltage may remain depressed even when none of the balancing resistors are active. The method 100 does not require any data samples with all cell balancing resistors turned off, i.e., with all of the gates G of FIG. 1 being open, thus avoiding this requirement.

While the best modes for carrying out the invention have been described in detail, those familiar with the art to which this invention relates will recognize various alternative designs and embodiments for practicing the invention within the scope of the appended claims.

The invention claimed is:

1. A method of diagnosing a cell voltage sensing board, the method comprising:
   connecting the cell voltage sensing board to a plurality of battery cells of a battery stack, wherein the cell voltage sensing board includes, for each of the battery cells, a line balancing resistor, a sense line resistor, and a gate that connects and disconnects the line balancing resistor from a corresponding one of the battery cells;
   measuring a cell voltage via the cell voltage sensing board for a selected battery cell of the plurality of battery cells;
   determining, using a relative position of the selected battery cell in the battery stack, the relative position recorded in memory of a controller, if the relative position of the selected battery cell corresponds to an uppermost cell or a lowermost cell in the battery stack;
   calculating a line sense resistance value for the selected battery cell via the controller using a first set of equations when the selected battery cell is the uppermost cell, using a second set of equations when the selected battery cell is the lowermost cell, and via a third set of equations when the selected battery cell is neither the uppermost cell nor the lowermost cell;
   comparing the calculated line sense resistance value to a calibrated resistance threshold via the controller; and executing a control action with respect to the cell voltage sensing board when the calculated line sense resistance value exceeds the calibrated resistance threshold, including recording a diagnostic code in the memory of the controller and preventing the use of the calculated line resistance value for the selected battery cell.

2. The method of claim 1, wherein measuring a cell voltage includes closing the gate corresponding to the selected battery cell via transmission of an output signal from the controller to the gate.

3. The method of claim 1, wherein measuring the cell voltage occurs only when a cell current balancing operation is not active.

4. The method of claim 1, wherein the first, second, and third sets of equations each include two equations, and wherein calculating a line sense resistance value includes solving both of the equations, finding a maximum solution to the equations, and then using only the maximum solution.

5. A system comprising:
- a cell voltage sensing board that is electrically connectable to a plurality of battery cells, wherein the cell sensing board includes, for each of the battery cells, a line balancing resistor, a line sense resistor, and a gate that respectively connects and disconnects the line balancing resistor to and from a corresponding one of the battery cells; and
- a controller in communication with the cell voltage sensing board, wherein the controller is programmed to:
    measure a cell voltage via the voltage sensing board for a selected battery cell of the plurality of battery cells;
    determine, using a relative position in the battery stack of the selected battery cell, the relative position recorded in memory of the controller, if the relative position of the selected battery cell is an uppermost or lowermost cell in the battery stack;
    calculate a line sense resistance value for the line sense resistor for the selected battery cell via a controller using a first set of equations when the selected battery cell is the uppermost cell, using a second set of equations when the selected battery cell is the lowermost cell, and using a third set of equations when the selected battery cell is neither the uppermost cell nor the lowermost cell;
    compare the calculated line sense resistance value to a calibrated resistance threshold via the controller; and
    execute a control action with respect to the cell voltage sensing board when the calculated line sense resistance value exceeds the calibrated resistance threshold, including at least one of: recording a diagnostic code in memory of the controller and preventing use of the calculated line resistance value for the selected battery cell, wherein the control action includes recording the diagnostic code in the memory of the controller and preventing the use of the calculated line resistance value for the selected battery cell.

6. The system of claim 5, wherein the controller measures the cell voltage by closing the gate corresponding to the selected battery cell via transmission of an output signal to the gate.

7. The system of claim 6, wherein the gates are solid-state switches positioned on an application-specific integrated chip.

8. The system of claim 7, wherein the controller measures the cell voltage only when a cell current balancing operation is not active.

9. The system of claim 5, wherein the first, second, and third sets of equations each include two equations, and wherein calculating a line sense resistance value includes solving both of the equations, finding a maximum solution to the equations, and then using only the maximum solution.

* * * * *